United States Patent
Chinn et al.

(10) Patent No.: US 6,830,950 B2
(45) Date of Patent: *Dec. 14, 2004

(54) INTEGRATED METHOD FOR RELEASE AND PASSIVATION OF MEMS STRUCTURES

(75) Inventors: Jeffrey D. Chinn, Foster City, CA (US); Rolf A. Guenther, Monte Sereno, CA (US); Michael B. Rattner, Santa Clara, CA (US); James A. Cooper, San Jose, CA (US); Toi Yue Becky Leung, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/300,970

(22) Filed: Nov. 20, 2002

(65) Prior Publication Data

US 2003/0166342 A1 Sep. 4, 2003

Related U.S. Application Data

(63) Continuation-in-part of application No. 09/850,923, filed on May 7, 2001, now Pat. No. 6,576,489.

(51) Int. Cl.[7] .................. H01L 21/00; H01L 21/479; C23E 1/00
(52) U.S. Cl. .................. 438/52; 438/477; 438/706; 438/216; 438/2
(58) Field of Search .................. 438/52, 477, 706; 216/2

(56) References Cited

U.S. PATENT DOCUMENTS

| 5,079,600 A | 1/1992 | Schnur et al. ............. 357/4 |
| 5,429,708 A | 7/1995 | Linford et al. ............ 216/66 |
| 5,537,083 A | 7/1996 | Lin et al. ................ 333/186 |
| 5,694,740 A | 12/1997 | Martin et al. ............. 53/431 |
| 5,869,135 A | 2/1999 | Vaeth et al. .............. 427/255 |
| 6,002,549 A | 12/1999 | Berman et al. ............ 360/104 |
| 6,020,247 A | 2/2000 | Wilk et al. ............... 438/398 |
| 6,027,571 A | 2/2000 | Kikuyama et al. .......... 134/3 |
| 6,046,966 A | 4/2000 | Drake et al. .............. 369/13 |
| 6,096,149 A | 8/2000 | Hetrick et al. ............ 156/155 |
| 6,114,044 A | 9/2000 | Houston et al. ............ 428/447 |
| 6,114,099 A | 9/2000 | Liu et al. ................ 430/324 |
| 6,159,540 A | 12/2000 | Menon et al. ............. 427/220 |
| 6,200,882 B1 | 3/2001 | Drake et al. ............. 438/464 |
| 6,235,340 B1 | 5/2001 | Lee et al. ............... 427/2.12 |
| 6,265,026 B1 | 7/2001 | Wang .................... 427/248.1 |
| 6,325,490 B1 | 12/2001 | Yang et al. .............. 347/45 |

FOREIGN PATENT DOCUMENTS

| WO | WO 00/52064 | 9/2000 | ........ C08F/8/00 |
| WO | WO 01/01475 A1 | 1/2001 | ........ H01L/21/326 |
| WO | WO 01/21863 A1 | 3/2001 | ........ C30B/29/66 |
| WO | WO 01/58655 A1 | 8/2001 | ........ B29C/41/02 |

OTHER PUBLICATIONS

Houston et al., "Ammonium Flouride Anti–Stiction Treatments for Polysilicon Microstructures", Transducers '95—Eurosensors IX. The 8th International Conference on Solid–State Sensors and Actuators, and Eurosensors IX. (Jun. 25–29, 1995). pp. 210–213.

(List continued on next page.)

Primary Examiner—W. David Coleman
(74) Attorney, Agent, or Firm—Shirley L. Church; Kathi Bean

(57) ABSTRACT

Disclosed herein is a method of improving the adhesion of a hydrophobic self-assembled monolayer (SAM) coating to a surface of a MEMS structure, for the purpose of preventing stiction. The method comprises pretreating surfaces of the MEMS structure with a plasma generated from a source gas comprising oxygen and, optionally, hydrogen. The treatment oxidizes the surfaces, which are then reacted with hydrogen to form bonded OH groups on the surfaces. The hydrogen source may be present as part of the plasma source gas, so that the bonded OH groups are created during treatment of the surfaces with the plasma. Also disclosed herein is an integrated method for release and passivation of MEMS structures.

38 Claims, 4 Drawing Sheets

OTHER PUBLICATIONS

Man et al., "Elimination of Post–Release Adhesion in Microstructures Using Conformal Flourocarbon Coatings", IEEE, vol. 6, No. 1, (Mar. 1997). pp. 25–34.

Houston, "Surface Treatments for Adhesion Reduction in Polysilicon Micromechanical Devices", vol. 5802B of Dissertations Abstracts International. (1996). p. 837.

Lee et al., "Fabrication of Surface Micromachined Polysilicon Actuators Using Dry Release Process of HF Gas–Phase Etching", IEEE (1996). pp. 30.1.1–30.1.4.

Smith et al., "Thin Teflon–Like films for Eliminating Adhesion in Released Polysilicon Microstructures", 1997 International conference on Solid–State Sensors and Actuators, (Jun. 16–19, 1997). pp. 245–248.

Srinivasan et al., "Self–Assembled Flourocarbon Films for Enhanced Stiction Reduction", IEEE, 1997, International Conference on Solid–State Sensors and Actuators, (Jun. 16–19, 1997). pp. 1399–1402.

Lee et al. "Dry Release for surface Micromachining with HF Vapor–Phase Etching", IEEE, vol. 6, No. 3, (Sep. 1997). pp. 226–233.

Yoshinori Matsumoto et al., "Flourocarbon film for protection from alkaline etchant and elimination of in–use stiction." 1997 International Conference on Solid–State Sensors and Actuators, (Jun. 16–19, 1997). pp. 695–698.

Srinivasan et al., "Alkyltrichlorosilane–Based Self–Assembled Monolayer Films for Stiction Reduction in Silicon Micromachines", IEEE, vol. 7, No. 2, (Jun. 1998). pp. 252–260.

Bustillo et al., "Surface Micromachining for Microelectromechanical Systems", Proceedings of the IEEE, vol. 86, No. 8, (Aug. 1998). pp. 1552–1573.

Komvopoulos, "Surface texturing and chemical treatment methods for reducing high adhesion forces at micromachine interfaces", Proceedings of the SPIE—The International Society for Optical Engineering, Vo. 3512, (1998). pp. 106–122.

Matsumoto et al., "Novel prevention method of stiction using silicon anodization for SOI structure." 1999 Elsevier Science S.A. pp. 153–159.

Bong–Hwan Kim et al., "A New Class of Surface Modifiers for Stiction Reduction", IEEE (1999). pp. 189–193.

Howe et al., "Silicon micromechanics: sensors and actuators on a chip", IEEE Spectrum, (Jul. 1999). pp. 29–35.

Ashurst et al., "Dichlorodimethylsilane as an anti–stiction monolayer for MEMS—a comparison to the octadecyltrichlosilane self–assembled monolayer", Journal of Microelectromechanical Systems (ISSN 1057–7157), vol. 10, No. 10, (Mar. 2000). pp. 41–49.

Senkevich et al., "Plasma enhanced chemical vapor deposition of fluorocarbon thin films via $CF_3H/H_2$ chemistries: Power, Pressure, and feed stock composition studies." J. Vac. Sci. Technol. A 18(2), (Mar./Apr. 2000). pp. 377–384.

Ashurst et al., "Alkene Based Monolayer Films as Anti–Stiction Coatings for Polysilicon Mems". Solid–State Sensor and Actuator Workshop, (Jun. 4–8, 2000). pp. 320–323.

Mayer et al., "Chemical vapor deposition of fluoroalkylsilane monolayer films for adhesion control in microelectromechanical systems", Journal of Vacuum Science & Technology B, vol. 18, No. 5, (Sep.–Oct. 2000). pp. 2433–2440.

Kim et al., "A New Organic Modifier for Anti–Stiction", Journal of Microelectromechanical Systems, vol. 13, No. 1, (Mar. 2001). pp. 33–40.

Lee et al., "Layer–by–Layer Assembly of Zeolite Crystals on Glass with Polyelectrolytes as Ionic Linkers". J. Am. Chem. Soc. 2001, 123, pp. 9769–9779.

Almanza–Workman et al., "Wettability modification of polysilicon for stiction reduction in silicon based microelectromechanical structures", Diffusion and Defect Data, Part B. Solid State Phenomena, vol. 76–77, (2001). pp. 23–26.

Bhushan, "Tribology on the macroscale to nanoscale of microelectromechanical system materials: a review", Journal of Engineering Tribology, vol. 215, No. J1. Proceedings of the Institution of Mechanical Engineers, Part J. (2001). pp. 1–18.

INTEGRATED METHOD FOR RELEASE AND PASSIVATION OF MEMS STRUCTURES

STATEMENT OF RELATED APPLICATION

This application is a continuation-in-part of U.S. patent application Ser. No. 09/850,923, filed May 7, 2001, now U.S. Pat. No. 6,576,489.

FIELD OF THE INVENTION

In general, the present invention is an integrated method for release and passivation of MEMS (micro-electro-mechanical systems) structures. In particular, the invention pertains to a method of improving the adhesion of a hydrophobic self-assembled monolayer (SAM) coating to a surface of a MEMS structure, for the purpose of preventing stiction.

BRIEF DESCRIPTION OF THE BACKGROUND ART

Micromachining technology compatible with semiconductor processes is used to produce a number of devices such as piezoelectric motors containing cantilever beams, hinges, accelerometers, reflector antennae, microsensors, microactuators, and micromirrors, for example. One of the most popular microactuators is an electrostatic comb driver, due to its simplicity in fabrication and low power consumption. Surface micromachining fabrication processes for the electrostatic comb driver, as well as other beams and lever arms, have problems with stiction of such beams and lever arms to an underlying layer over which the beam or arm extends. The lever arm becomes deformed from its intended position, so that it does not extend out as desired. In the case of a membrane or diaphragm, the membrane or diaphragm becomes deformed from its intended position and may become stuck to an adjacent surface. Stiction is the number one yield-limiting problem in the production of the kinds of devices described above.

FIGS. 1A through 1C are simple schematics showing a cross-sectional side view of a starting structure for surface machining of a lever arm, the desired machined lever arm, and a lever arm which has been rendered non-functional due to stiction, respectively.

The FIG. 1A structure shows a substrate layer 102 (typically single crystal silicon), a portion of which is covered with a sacrificial layer 104 (typically silicon oxide), and a lever arm layer 106 (typically polysilicon) which is in contact with and adhered to substrate layer 102 at one end of lever arm layer 106. FIG. 1B shows the FIG. 1A structure after the removal of sacrificial layer 104 to produce the desired free-moving lever arm 107. The height "h" of gap 108 between lever arm 107 and substrate 102, the length "l", and the cross-sectional thickness "t" of the lever arm 107 depend on the particular device in which the structure is employed. In many instances the relative nominal values of "h", "l", and "t" are such that capillary action during the fabrication process; or contaminants formed as byproducts of the fabrication process; or van der Waals forces; or electrostatic charges on the upper surface 110 of substrate layer 102 and/or on the undersurface 112 of lever arm layer 106, may cause lever arm 106 to become stuck to the upper surface 110 of substrate layer 102. This problem is referred to as "stiction", and is illustrated in FIG. 1C. Stiction may occur during formation of the lever arm 107, or may occur subsequent to fabrication of the device and during packaging, shipment, or use (in-use stiction) of the device.

A single crystal silicon or polysilicon surface of the kind which is frequently used to fabricate a lever arm, beam, membrane, or diaphragm is hydrophilic in nature, attracting moisture, which may cause stiction.

Stiction, which is the primary cause of low yield in the fabrication of MEMS devices, is believed to result from a number of sources, some of the most significant being capillary forces, surface contaminants, van der Waals forces, and electrostatic attraction. Factors which may contribute to stiction include: warpage due to residual stresses induced from materials; liquid-to-solid surface tension which induces collapse; drying conditions during processing; adverse and harsh forces from wet baths; aggressive designs (i.e., long and thin beams); surface-to surface attractions; inadequate cleaning techniques; aggressive cleaning techniques; and environments subsequent to fabrication, including packaging, handling, transportation, and device operation.

Various processes have been developed in an attempt to prevent stiction from occurring during fabrication of micromachined arms and beams. To reduce the possibility of stiction subsequent to release of a beam, lever arm, membrane, or diaphragm (so that it extends over open space), a surface treatment may be applied and/or a coating may be applied over freestanding and adjacent surfaces. For example, in U.S. Pat. No. 6,069,149, to Hetrick et al, issued Aug. 1, 2000, the inventors disclose a method for fabricating an adhesion-resistant microelectromechanical device. Amorphous hydrogenated carbon is used as a coating or structural material to prevent adhesive failures during the formation and operation of a microelectromechanical device. (Abstract) The amorphous hydrogenated carbon (AHC) coating is applied on the micromachined device after removal of the sacrificial layer and release of the structure. The sacrificial layer is removed in a wet etching solution such as hydrofluoric acid or buffered HF acid. (Col. 7, lines 26–32.) The method is said to reduce adhesive forces between microstructure surfaces by altering their surface properties. The AHC is said to create a hydrophobic surface, which results in lower capillary forces and an associated reduction in stiction. (Col. 2, lines 66–67, continuing at Col. 3, lines 1–4.)

U.S. Pat. No. 5,403,665, issued Apr. 4, 1995, to Alley et al., discloses a method of applying a self-assembled alkyltrichlorosilane monolayer lubricant to micromachines. Octadecyltrichlorosilane (OTS; $C_{18}H_{37}SiCl_3$) is provided as an example of an alkyltrichlorosilane. In a dilute, non-polar, non-aqueous solution, OTS will deposit on silicon, polysilicon, and silicon nitride surfaces that have been previously treated to form a hydrophilic chemical oxide. Treatment of the silicon, polysilicon, or silicon nitride surfaces may be accomplished with an approximately 5 to 15 minute exposure to a hydrophilic chemical oxide promoter such as Piranha ($H_2O_2$:$H_2SO_4$), RCA SC-1, or room temperature $H_2O_2$. This treatment changes silicon and polysilicon surfaces from hydrophobic to hydrophilic. Thus, the surface will have a thin layer of adsorbed water. The OTS reacts with the thin adsorbed water layer that is present on the treated surface to form a single layer of molecules that are chemically bonded to the surface. (Col. 3, lines 23–40; Col. 4, lines 19–30)

SUMMARY OF THE INVENTION

The present invention pertains to the application of a hydrophobic, self-assembled monolayer (SAM) coating on a surface of a MEMS (micro-electro-mechanical systems)

structure, for the purpose of preventing stiction. In particular, the invention pertains to a method of improving the adhesion of a hydrophobic SAM coating to a surface of a MEMS structure.

Self-assembled monolayer (SAM) coatings are known in the art. Self-assembly is a process in which a single, densely packed molecular layer of a material is selectively deposited on a fresh reactive surface. The process self-terminates after single layer coverage is achieved. SAM coatings are typically deposited from precursor long-chain hydrocarbons or fluorocarbons with a chlorosilane-based head, such as alkylchlorosilanes. Effective alkylchlorosilanes include OTS (octadecyltrichlorosilane; $C_{18}H_{37}SiCl_3$), FDTS (perfluorodecyltrichlorosilane; $C_{10}H_4F_{17}SiCl_3$), and DMDS (dimethyldichlorosilane; $(CH_3)_2SiCl_2$), by way of example, and not by way of limitation. The chemical structures of OTS and FDTS are shown in FIG. 2A (respectively indicated by reference numerals 200 and 210).

To improve the adhesion, prior to the application of a SAM coating, surfaces of a MEMS structure are treated with a plasma which was generated from a source gas comprising oxygen and, optionally, a source of hydrogen. The treatment oxidizes the surfaces, which are then reacted with hydrogen to form bonded OH groups on the surfaces. The hydrogen source may be present as part of the plasma source gas, so that the bonded OH groups are created during treatment of the surfaces with the plasma. Examples of hydrogen sources include $NH_3$ or steam, by way of example and not by way of limitation. In the alternative, the plasma-treated, oxidized surfaces may be subsequently exposed to a gas containing a source of hydrogen, such as a mixture of hydrogen with an inert gas, or $NH_3$, so that the oxidized surface reacts with the hydrogen to create bonded OH groups on the MEMS surfaces.

The plasma used to oxidize the MEMS structure surface should have a plasma density of about $1 \times 10^8$ $e^-/cm^3$ or less at the substrate surface, and the plasma treatment should be carried out without a bias applied to the substrate. Typically, the plasma density is within the range of about $1 \times 10^7$ $e^-/cm^3$ to about $1 \times 10^8 e^-/cm^3$ at the substrate surface.

Typically, the plasma used to treat the MEMS structure surfaces is an externally generated plasma. The use of an external plasma generation source provides the ability to control the plasma to exhibit a low, yet uniform, ion density, preventing undesirable etching and/or ion bombardment of the MEMS structure surface during oxidation of the surface. The plasma pretreatment process of the invention is a very gentle, isotropic process which is performed for the sole purpose of preparing the surface for reaction with a SAM precursor. The surfaces may be silicon-containing surfaces or other surfaces within a MEMS structure, including, but not limited to, metal-containing surfaces. The highly isotropic process allows all exposed surfaces of the MEMS structure to be contacted with the plasma.

Oxygen typically makes up about 20 volume % to about 100 volume % of the reaction-generating portion of the plasma source gas. The source of hydrogen is typically $NH_3$ or steam, by way of example, and not by way of limitation. If $NH_3$ is used, the $NH_3$ typically makes up about 0.1 volume % to about 20 volume % of the reaction-generating portion of the plasma source gas. More typically, the $NH_3$ makes up about 0.5 volume % to about 10 volume % of the reaction-generating portion of the plasma source gas. The presence of nitrogen in the plasma source gas speeds up the rate of oxidation. Nitrogen ($N_2$) may be present at about 20 volume % to about 80 volume % of the reaction-generating portion of the plasma source gas.

The plasma source gas may also include a nonreactive diluent gas, such as argon, helium, neon, xenon, krypton, and combinations thereof, for example, and not by way of limitation. The nonreactive diluent gas typically makes up about 20 volume % to about 80 volume % of the plasma source gas, with the remaining 80 volume % to 20 volume % being the reaction-generating portion of the plasma source gas.

FIG. 2A shows one example of a precursor 210 to a SAM coating, which is reacted with the surface 220 shown in FIG. 2B, to produce a SAM, as shown in FIG. 2C. FIG. 2B shows a hydrolyzed surface 220 of a MEMS structure. During application of a SAM coating, the chlorosilane-based head of an alkylchlorosilane, shown as 212 in FIG. 2A, may be reacted with the hydrolyzed surface, shown as 220 in FIG. 2B, liberating one molecule of HCl for each Si—Cl bond that is hydrolyzed. FIG. 2C shows a MEMS surface 230 on which a self-assembled monolayer of individual FDTS molecules 210 has been grown. A similar structure may be achieved for a self-assembled monolayer of individual OTS molecules.

Also disclosed herein is an integrated method for release and passivation of a MEMS structure which includes the pretreatment process prior to SAM application which was described above. According to the integrated process, a substrate including at least one MEMS structure is loaded into a processing chamber. A first pretreatment step includes contacting the substrate with a plasma which is generated from a source gas comprising oxygen. This pretreatment removes any moisture, particles, or contaminants present on the substrate surface prior to MEMS release. A release process is then performed, during which a sacrificial layer present within the MEMS structure is removed. The release process is typically a cyclic etch/cleaning procedure, where release is accomplished by plasmaless etching of a sacrificial layer material, followed by a cleaning step in which byproducts from the etch process and other contaminants which may lead to stiction are removed. A second pretreatment, comprising contacting surfaces of the MEMS structure with a plasma generated from a source gas comprising oxygen and, optionally, a source of hydrogen. The treatment oxidizes the surfaces, which are then reacted with hydrogen to form bonded OH groups on the surfaces. The hydrogen source may be present as part of the plasma source gas, so that the bonded OH groups are created during treatment of the surfaces with the plasma. Examples of hydrogen sources include $NH_3$ or steam, by way of example and not by way of limitation. In the alternative, the plasma-treated, oxidized surfaces may be subsequently exposed to a gas containing a source of hydrogen, such as a mixture of hydrogen with an inert gas, or $NH_3$, so that the oxidized surface reacts with the hydrogen to create bonded OH groups on the MEMS surfaces.

Subsequent to formation of the hydroxyl groups, the MEMS structure surfaces are exposed to a reactant which produces a self-assembled monolayer (SAM) coating. During application of the SAM coating to surfaces of the MEMS structure, a SAM coating typically forms on surfaces of the processing chamber. This SAM coating needs to be removed from surfaces of the processing chamber prior to the performance of subsequent processing steps within the chamber. Therefore, after removal of the substrate from the chamber, a chamber cleaning step is typically carried out, in which surfaces of the processing chamber are contacted with a plasma generated from a source gas comprising oxygen, whereby residual SAM is removed from processing chamber surfaces.

Figure 1A:
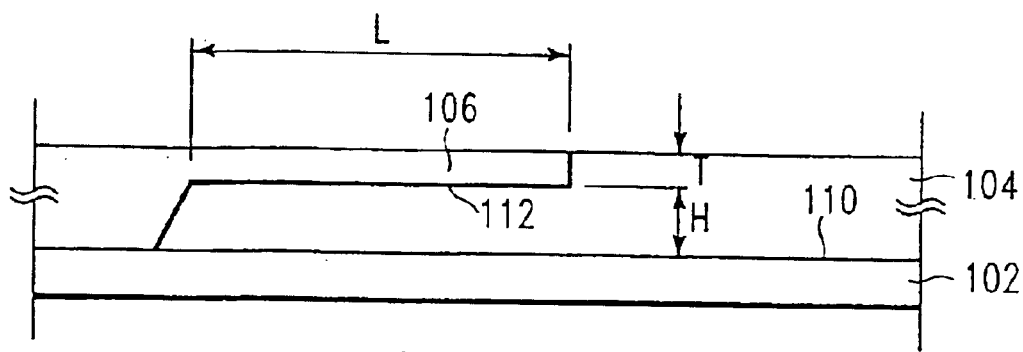
FIGS. 1A through 1C are simple schematics showing, respectively, a starting structure for surface machining of a lever arm, the desired machined lever arm, and a lever arm which has been rendered non-functional due to stiction.

The FIG. 1A schematic structure shows a substrate layer 102, a portion of which is covered with a sacrificial layer 104, and a lever arm layer 106 which is in contact with and adhered to substrate layer 102 at one end of lever arm layer 106.

Figure 1B:
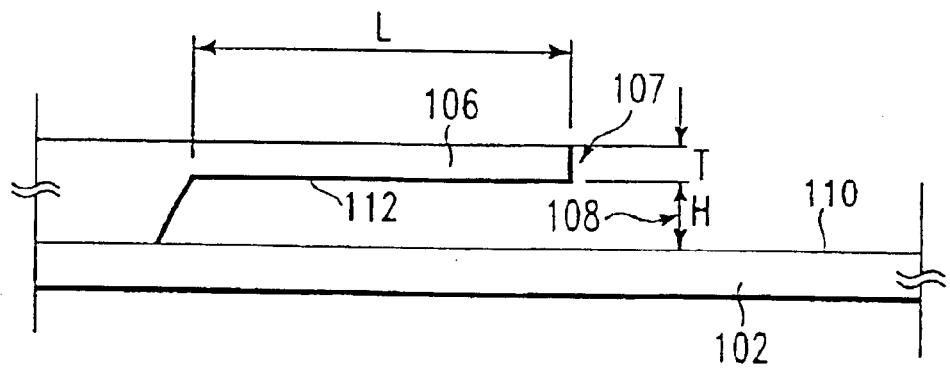

FIG. 1B shows the FIG. 1A schematic structure after the removal of sacrificial layer 104 to produce the desired free-moving lever arm 107.

Figure 1C:
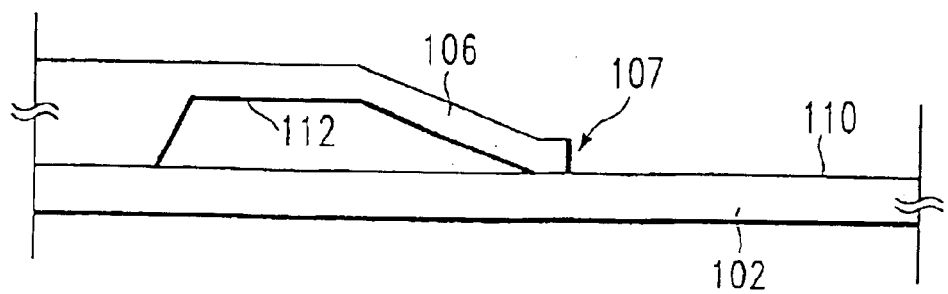

FIG. 1C illustrates a problem which is referred to as "stiction", where, during fabrication of the device including lever arm 107, or subsequent to fabrication and during use of the device, lever arm 107 becomes stuck to an adjacent surface (typically the substrate 102 beneath lever arm 107).

Figure 2A:
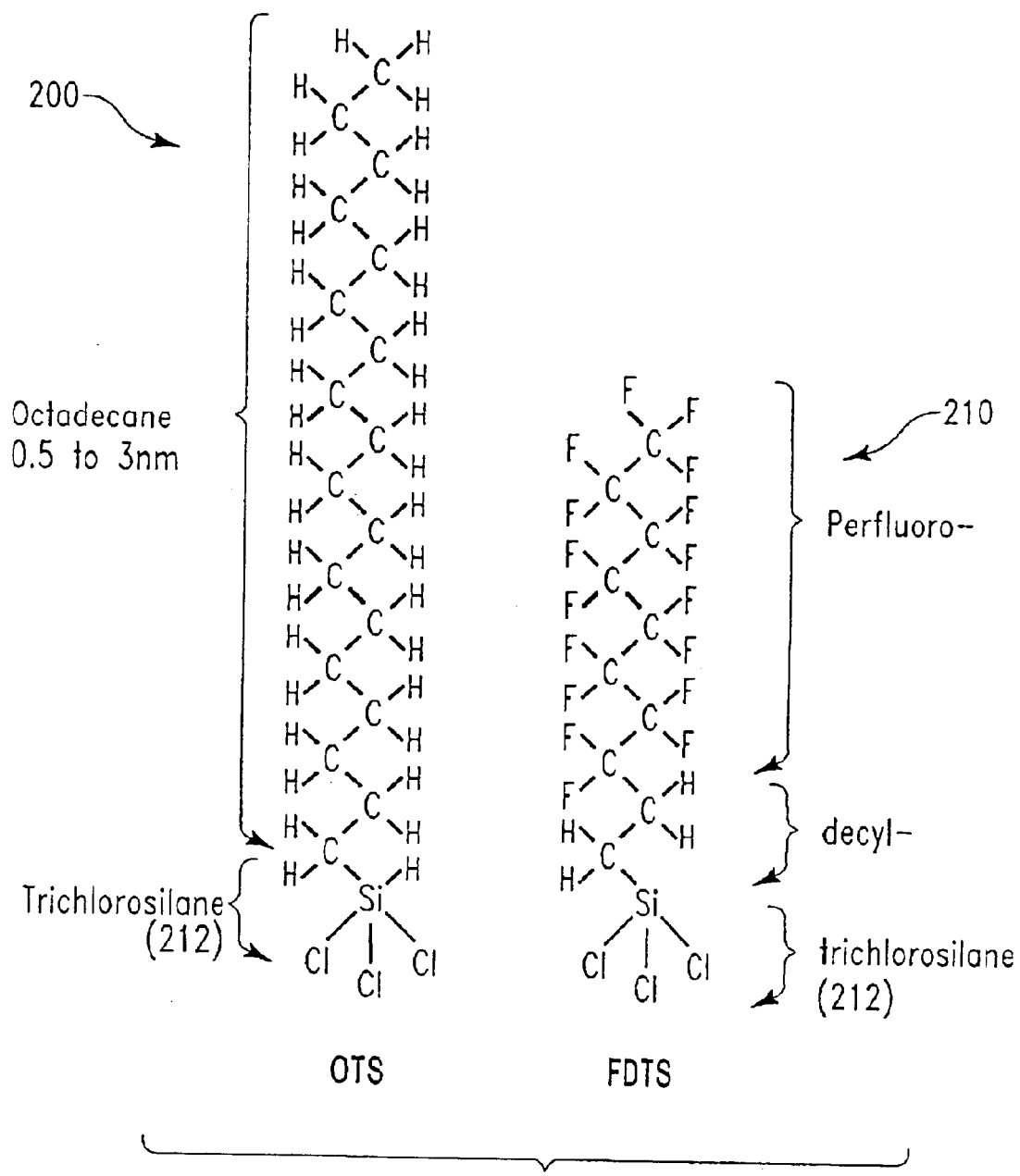

FIG. 2A shows the chemical structures of OTS (octadecyltrichlorosilane; $C_{18}H_{37}SiCl_3$), 200, and FDTS (perfluorodecyltrichlorosilane; $C_{10}H_4F_{17}SiCl_3$), 210, which are precursors for the formation of a SAM.

Figure 2B:
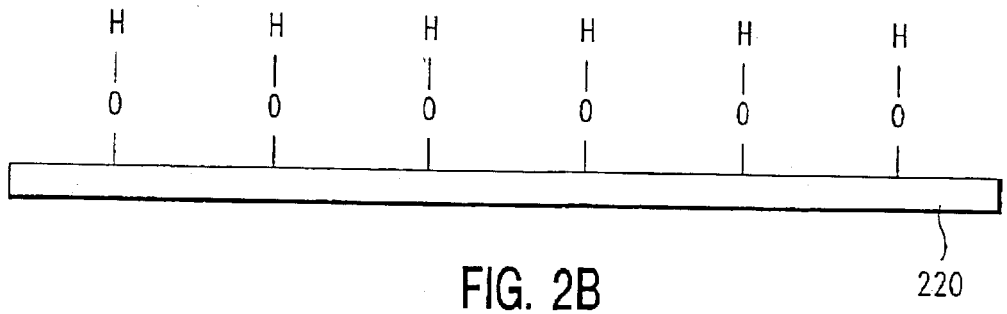

FIG. 2B shows a hydrolyzed surface 220 of a MEMS structure.

Figure 2C:
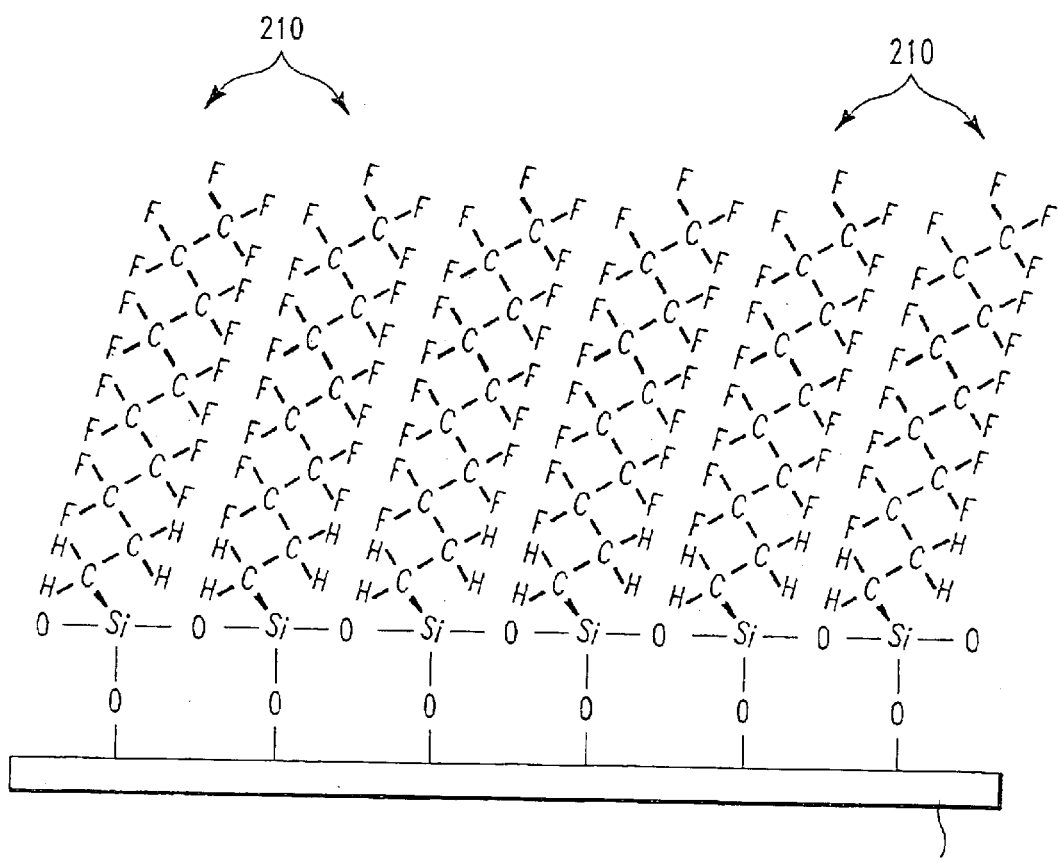

FIG. 2C shows a MEMS surface 230 on which a self-assembled monolayer of individual FDTS molecules 210 has been grown.

Figure 3:
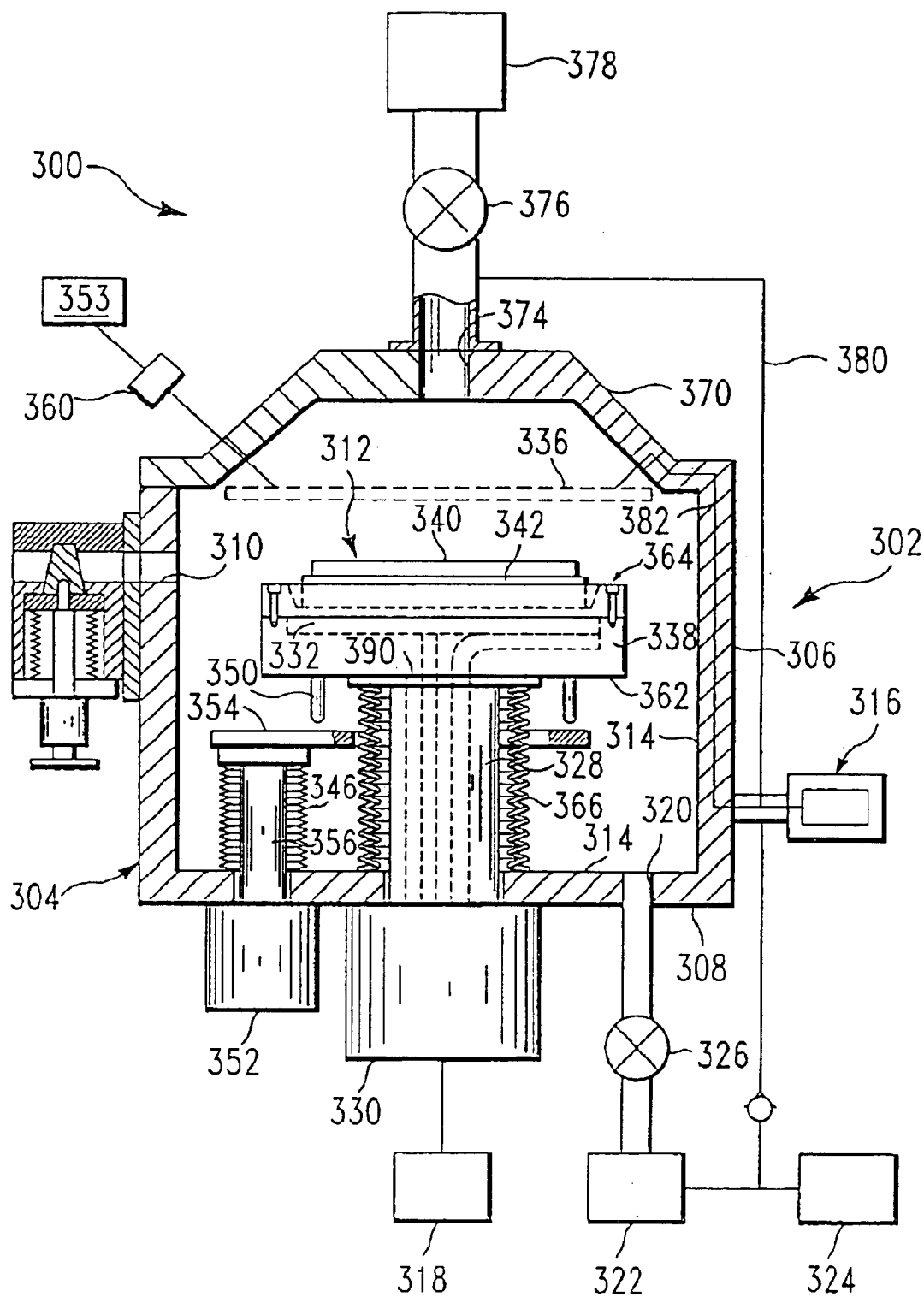

FIG. 3 is a cross-sectional schematic of a plasma processing system of the kind which was used to carry out the experimentation described herein.

DETAILED DESCRIPTION OF THE INVENTION

Disclosed herein is an integrated process for release and passivation of MEMS structures which includes formation of a SAM on MEMS surfaces. Exemplary processing conditions for performing various embodiments of the method of the invention are set forth below.

As a preface to the detailed description, it should be noted that, as used in this specification and the appended claims, the singular forms "a", "an", and "the" include plural referents, unless the context clearly dictates otherwise.

I. An Apparatus for Practicing the Invention

FIG. 3 shows a cross-sectional schematic of a plasma processing system of the kind which was used to carry out the experimentation described herein. The system 300 generally includes a processing chamber 302 coupled to a gas delivery system 316. The processing chamber 302 includes a chamber body 304 that has walls 306, a bottom 308, and a lid assembly 370 defining a process volume 312. The process volume 312 is typically accessed through a substrate access port 310 formed through the walls 306 that facilitates movement of a workpiece or substrate 340 into and out of the processing chamber 302. Optionally, the substrate 340 may be disposed on a carrier 342 that travels with the substrate 340 during processing.

An exhaust port 320 is formed through the wall 306 or bottom 308 of the chamber body 304, and couples the interior volume 312 to a vacuum pumping system 322. A shut-off valve/pressure control valve 326 is typically disposed between the vacuum pumping system 322 and the exhaust port 320 to selectively isolate the vacuum pumping system 322 from the interior volume 312 and to regulate the pressure in 312 when in use. The vacuum pumping system 322 is coupled to a disposal system 324 to condition, recycle, and/or store the gases exiting the chamber body 304.

A temperature-controlled substrate support assembly 338 is centrally disposed within the processing chamber 302. The support assembly 338 supports the substrate 340 (and carrier 342, when used) during processing. In one embodiment, the substrate support assembly 338 has at least one embedded temperature control device 332 (shown in phantom) and a thermocouple 390 disposed therein. The temperature control device 332 and the thermocouple 390 are coupled to a controller 318. The controller 318 utilizes information obtained from the thermocouple 390 to control the temperature control device 332, so that the substrate support assembly 338 and the substrate 340 are maintained at a predetermined temperature during processing.

The substrate support assembly 338 includes a plurality of lift pins 350 disposed therethrough. The lift pins 350 are typically comprised of ceramic or anodized aluminum. A lift plate 354 is disposed between the substrate support assembly 338 and chamber bottom 308 and is coupled to a lift actuator 352 by a shaft 356. The lift actuator 352 may be energized to elevate the lift plate 354. As the lift plate 354 is elevated, the lift plate 354 contacts the lift pins 350 extending below the substrate support assembly 338 and causes the lift pins to project above the substrate support assembly 338, thus placing the substrate 340 in a spaced-apart relation relative to the substrate support assembly 338 to facilitate substrate hand-off with a transfer robot (not shown). Bellows 346, coupled between the shaft 356 and chamber bottom 306, maintain the isolation of the process volume 312 from the environment exterior to the processing chamber 302 while the elevation of the lift plate 354 is moved.

The support assembly 338 has a lower side 362 and an upper side 364 that supports the substrate 340. The lower side 362 is coupled to a lift mechanism 330 by a stem 328 that passes through the chamber bottom 308. The lift mechanism 330 moves the support assembly 338 between an elevated processing position and a lowered position (as shown) to facilitate substrate transfer through the access port 310. A bellows 366 provides a flexible vacuum seal between the chamber volume 312 and the atmosphere outside the processing chamber 302, while facilitating the movement of the support assembly 338. The stem 328 additionally provides a conduit for electrical and thermocouple leads between the support assembly 338 and other components of the system 300. The support assembly 338 is generally grounded.

The lid assembly 370 is supported by the walls 306 and includes a center port 374 through which process and other gases may be delivered to the interior volume 312 of the process chamber 302. A remote plasma generator 378 is coupled to the center port 374. The remote plasma generator 378 typically provides a cleaning agent, such as fluorine radicals, to clean the interior of the chamber body 304. The remote plasma generator 378 improves chamber life and reduces particle generation by minimizing RF exposure of chamber components during chamber cleaning. The remote plasma generator 378 may be coupled to the gas delivery system 316 to excite certain gases being delivered to the interior volume 312 of the chamber body 304.

An optional distribution plate 336 is coupled the lid assembly 370 below the center port 374. The distribution plate 336 is typically fabricated from aluminum alloy, substantially pure aluminum or nickel alloys. The center section of the distribution plate 336 includes a perforated area through which process and other gases supplied from the gas delivery system 316 are delivered to the process volume 312. The perforated area of the distribution plate 336 is configured to provide uniform distribution of gases passing through the distribution plate 336 into the processing chamber 302.

In one embodiment, RF power is supplied by a power source 358 to the distribution plate 336 (or other electrode positioned within or near the lid assembly of the chamber) to excite the gases disposed in the process volume 312 between the support assembly 338 and the distribution plate 336. The RF power from the power source 358 is generally selected commensurate with the size of the substrate to drive the release process. Typically, a matching circuit 360 is coupled between the power source 358 and distribution plate 336.

A more detailed description and schematics of the plasma processing system shown in FIG. 3 is provided in commonly assigned, copending U.S. Provisional Application Serial No. 60/415,196, filed Sep. 30, 2002, which is hereby incorporated by reference herein in its entirety.

Although the plasma processing system which was used to process the substrates described herein is shown in schematic in FIG. 3, one skilled in the art may use any plasma processing chamber available in the industry. Preferably, the chamber should be capable of being used in combination with an externally generated plasma source. For example and not by way of limitation, remote plasma generators are commercially available from MKS Instruments, Inc. (Andover, Mass.). In general, the plasma source should be located as close to the processing chamber as possible in order to maintain the etchant species in their ionized state, but far enough away from the chamber to avoid undue physical bombardment of the substrate by the ionized species.

As an alternative to the remote RF plasma generator shown in FIG. 3, the method of the invention may be performed in an apparatus having a microwave plasma generation source located internal to the processing chamber, but a sufficient distance away from the substrate so that ion bombardment of the substrate is minimal.

II. An Integrated Method for Release and Passivation of a Mems Structure

According to an exemplary embodiment method of the invention, a substrate including at least one MEMS structure is loaded into a processing chamber. An exemplary processing system 300 for use in the present integrated process is illustrated schematically in FIG. 3. One skilled in the art can envision minor variations in apparatus arrangement which can be used to obtain a similar result.

Next, the substrate is contacted with a plasma generated from a first pretreatment source gas comprising oxygen. Oxygen typically makes up about 20 volume % to about 100 volume % of the reaction-generating portion of the plasma source gas.

The first pretreatment source gas may also include $NH_3$. If $NH_3$ is used, the $NH_3$ typically makes up about 0.1 volume % to about 20 volume % of the reaction-generating portion of the plasma source gas. More typically, the $NH_3$ makes up about 0.5 volume % to about 10 volume % of the reaction-generating portion of the first pretreatment source gas. Nitrogen ($N_2$) may be present at about 20 volume % to about 80 volume % of the reaction-generating portion of the plasma source gas.

The first pretreatment source gas may also include a nonreactive diluent gas, such as argon, helium, neon, xenon, krypton, and combinations thereof, for example, and not by way of limitation. The nonreactive diluent gas typically makes up about 20 volume % to about 80 volume % of the first pretreatment source gas, with the remaining 80 volume % to 20 volume % being the reaction-generating portion of the plasma source gas.

Typical processing conditions for the first pretreatment step are as follows: 500–1000 sccm of $O_2$; 5–50 sccm of $NH_3$; 4–10 Torr process chamber pressure; and about 5 kW plasma source power. The first pretreatment step is performed at a substrate temperature within the range of about 20° C. to about 80° C.; more typically, within the range of about 20° C. to about 50° C. Processing time is typically within the range of about 2 minutes to about 3 minutes. The processing conditions set forth above are for use with the plasma processing system shown in schematic in FIG. 3; however, one skilled in the art may use any suitable plasma processing system available in the industry, with appropriate adjustments to the processing conditions.

The plasma is typically generated by an external plasma generation source (indicated by reference numeral 378 in FIG. 3). As used herein, the term "externally generated plasma" or "remote plasma" refers to a plasma which is generated outside of the processing chamber, then piped into the processing chamber (as opposed to an in situ generated plasma, which is generated inside the chamber itself).

A release process is then performed, during which a sacrificial layer present within the MEMS structure is removed. A number of MEMS release processes are known in the art.

An advantageous release process for fabricating a surface within a MEMS structure which is free-moving in response to a stimulus is disclosed in commonly assigned, copending U.S. application Ser. No. 10/046,593, filed Oct. 29, 2001 ("the '593 Application"), which is hereby incorporated by reference in its entirety. According to the '593 Application, the free-moving surface is fabricated in a series of steps which includes a release process, where release is accomplished by plasmaless etching of a sacrificial layer material, followed by a cleaning step in which byproducts from the etch process and other contaminants which may lead to stiction are removed. There are a series of etch and then clean steps so that a number of "cycles" of these steps are performed. In the cyclic etch/cleaning procedure, a portion of a sacrificial layer is removed, followed by a cleaning step, and the process is repeated until the desired amount of sacrificial layer is removed. The number of etch/clean cycles required in a given instance depends on the dimensions of the free-moving structure which is being fabricated.

In one embodiment of the method disclosed in the '593 Application, a micromachined polysilicon actuator is fabricated. During fabrication of the actuator, a starting structure of the kind illustrated in FIG. 1A is used to generate a lever arm 107 of the kind shown in FIG. 1B. The actuator includes an actuation electrical contact pad (not shown). With respect to the FIG. 1A starting structure, a first portion of the upper surface 110 of a silicon substrate 102 is in contact with an overlying layer of silicon oxide 104, while a second portion of the upper surface 110 is in contact with a layer 106 of polysilicon. A portion of the bottom surface 112 of polysilicon layer 106 is also in contact with silicon oxide layer 104, in the area where silicon oxide layer 104 overlies silicon substrate 102, so that polysilicon layer 106 extends over the upper surface 110 of silicon substrate 102. Silicon oxide layer 104 then fills a gap having a height "h", between the upper surface 110 of silicon substrate 102 and the lower surface 112 of polysilicon layer 106. To create the lever arm shown in FIG. 1B, the silicon oxide layer 104 is removed. Thus, this silicon oxide layer 104 is referred to as a "sacrificial" layer.

To prevent the lever arm 107 shown in FIG. 1B from becoming stuck to silicon substrate 102 during fabrication, the etch process used to remove silicon oxide layer 104 must not place undue forces upon lever arm 107 which cause harmful deformation of lever arm 107. In addition, any byproducts and contaminants generated during the etch process which might cause stiction of lever arm 107 to substrate 102 must be removed.

When the sacrificial layer is an oxide, the etchant used to remove the sacrificial layer is typically a fluorine-containing etchant. When the sacrificial layer is an organic polymeric layer, the etchant used to remove the sacrificial layer is typically an oxygen-species containing etchant. When the sacrificial layer is a metal-containing layer, the etchant is typically a chlorine-containing etchant. The etchant is selected to etch the sacrificial layer more rapidly than other layers exposed to the etchant, and to minimize or avoid the formation of chemical compounds which are harmful to the MEMS surfaces which remain after removal of the sacrificial layer. The cleaning agent used depends on the byproducts produced during etching of the sacrificial layer, the ease of removal of the cleaning agent (along with the byproducts which are removed with the cleaning agent), and the surface properties which are generated on the structure surfaces which are contacted by the cleaning agent.

When the sacrificial layer is an oxide, and the structural surfaces adjacent the oxide include at least one of single-crystal silicon (silicon), polysilicon, or silicon nitride, the etchant for removal of the oxide is typically a vapor of an HF/catalyst mixture. The most advantageous catalyst is water, as water provides a faster etch rate; however, other polar molecules which can provide OH⁻ ions may be used as a catalyst. Examples of other catalysts include chemical compounds which can be present in a vapor state under the same processing conditions at which HF is present in a vapor state, such as chemical compounds having the formula $C_xH_y(OH)_z$, where x ranges from 1–3, y ranges from 3–9 and z ranges from 1–2. Alcohols and ketones work well. Chemical compounds having the formula $C_aH_bO_c$, where a ranges from 1–3, b ranges from 2–8, and c ranges from 2–4, may also be used, such as acetic acid. Typically, the catalyst concentration in the HF/catalyst mixture is less than about 25% by volume. It is important that the HF/catalyst mixture be maintained as a vapor in the process chamber, with the exception of a thin film (a few monolayers) on the surface of the substrate. Thus, the catalyst concentration in the HF/catalyst vapor is dependent on the temperature and pressure under which the etching of the sacrificial oxide layer is carried out.

In the case of an HF/water mixture, where the ratio of HF:water is 10:1 or greater, the substrate temperature during etching is maintained between about 25°C. and about 50° C., and typically is maintained below about 45° C. The temperature of the process chamber walls is generally slightly higher than the substrate temperature, in order to prevent condensation. The pressure in the process chamber is slightly below that which would provide general condensation of the HF/water mixture on the substrate, fine-tuned to provide the thin film monolayer of condensed HF/water mixture on the substrate surface. For process integration reasons, it is helpful when the process chamber is operated at less than one atmosphere of pressure, and the substrate temperature may be adjusted to accommodate operation at such pressure. Desirable operating pressures range between about 300 Torr and about 600 Torr, for example.

The cleaning agent used subsequent to the HF/catalyst etchant mixture is a vaporous chemical compound which is polar in nature. Examples include chemical compounds having the formula $C_xH_y(OH)_z$, where x ranges from 1–3, y ranges from 3–9, and z ranges from 1–2. Methanol, ethanol, and isopropyl alcohol (IPA) have been demonstrated to perform well as cleaning agents. Ketones such as acetone are expected to work well also. Additional example cleaning agents include chemical compounds having the formula $C_aH_bO_c$, where a ranges from 1–3, b ranges from 2–8, and c ranges from 2–4. Acetic acid, which is a compound having this formula, performs well as a cleaning agent.

When the sacrificial layer is an organic polymeric layer, and the structural surfaces adjacent the organic polymeric layer include a metal, the etchant for removal of the organic polymeric sacrificial layer is typically an oxygen-containing active species which oxidizes the polymeric layer into a volatile reaction product which is easily removed from the processing chamber. The cleaning agent used to remove reaction byproducts and contaminants may be one of the cleaning agents described above with reference to the use of an oxide sacrificial layer.

When the sacrificial layer is a metal-containing layer, and the structural surfaces adjacent the metal layer include an oxide, the etchant for removal of the metal sacrificial layer is typically a chlorine-containing active species which reacts with the metal-containing layer to provide volatile reaction products which are easily removed from the processing chamber. The cleaning agent used to remove reaction byproducts and contaminants may be one of the cleaning agents described above with reference to the use of an oxide sacrificial layer.

An important feature is the use of more than one etch/clean cycle to fabricate the free-moving structure, such as a lever arm, beam, membrane, or diaphragm, for example. The number of etch/clean cycles required depends on the feature being etched. For a beam or a lever arm, the cross-sectional dimensions of the arm, the unsupported length of the arm, and the gap between the arm and the underlying substrate are important factors. For a beam or arm having an effective cross-sectional radius in the range of 2 $\mu$m or less, the longer the unsupported length of the arm, and the more narrow the gap between the arm and adjacent substrates, the more easily the unsupported arm or beam length can be deformed, and the larger the number of cycles which are necessary to avoid stiction during the fabrication process. The aspect ratio of the gap can be used to estimate the required number of cycles. The aspect ratio of the gap is the ratio of the length of the gap (the unsupported length of the beam or lever arm) to the minimum cross-sectional dimension of the gap. As a starting point, the aspect ratio can be maintained at about 1:1, and the number of cycles used can be nominally in the magnitude of the aspect ratio. For example, if the aspect ratio is 20:1, about 15 to 30 cycles may be used. One skilled in the art can adjust the number of etch/clean cycles depending on the results obtained from this starting point.

Alternative embodiment release processes for fabricating MEMS structures are disclosed in commonly assigned, copending U.S. Provisional Application Serial No. 60/415, 196, filed Sep. 30, 2002 ("the '196 Application"), which is incorporated by reference in its entirety and which was discussed above with respect to the processing system 300 shown in FIG. 3. According to one embodiment, a substrate having an oxide sacrificial layer is introduced into the processing chamber and heated to a temperature of about 30° C. to about 55° C. The process chamber pressure is increased to about 900 Torr to about 4000 Torr.

The oxide sacrificial layer is then released to form microstructures by etching the oxide layer with an etchant, which typically includes HF, methanol ($CH_3HO$), and water. HF is typically supplied at a rate of about 1000 sccm to about 4000 sccm. Water is typically supplied at a rate of about 20 sccm to about 100 sccm. Methanol is typically supplied at a rate of about 20 sccm to about 100 sccm. The etch endpoint is typically detected using mass spectrometry or by monitoring the transmission and reflectance of a particular wavelength of light in the infrared range.

In an alternative embodiment release process disclosed in the '196 Application"), a substrate having a silicon sacrificial layer is introduced into the processing chamber and heated to a temperature of about 40° C. to about 55° C. The process chamber pressure is then reduced to about 1 Torr to about 360 Torr, depending on the concentration of the active etchant to be used.

The silicon sacrificial layer is then released to form microstructures by etching the silicon layer with an etchant, which typically includes $XeF_2$. $XeF_2$ is typically delivered at a rate of about 10 sccm to about 20 sccm, in a carrier gas of $N_2$, helium, argon, or neon. Alternatively, the etchant may be a plasma generated from a source gas comprising $NF_3$. $NF_3$ is typically delivered at a rate of about 100 sccm to about 500 sccm. The etch endpoint is typically detected using mass spectrometry.

After performing a release process using one of the methods known in the art, it is often desirable to apply a coating over the substrate which will prevent stiction during handling and use of the device. Self-assembled monolayer (SAM) coatings are known in the art. Self-assembly is a process in which a single, densely packed molecular layer of a material is selectively deposited on a fresh reactive surface. The process self-terminates after single layer coverage is achieved. SAM coatings are typically deposited from precursor long-chain hydrocarbons or fluorocarbons with a chlorosilane-based head, such as alkylchlorosilanes. Effective alkylchlorosilanes include OTS (octadecyltrichlorosilane; $C_{18}H_{37}SiCl_3$), FDTS (perfluorodecyltrichlorosilane; $C_{10}H_4F_{17}SiCl_3$), and DMDS (dimethyldichlorosilane; $(CH_3)_2SiCl_2$), for example and not by way of limitation. The chemical structures of OTS and FDTS are shown in FIG. 2A (respectively indicated by reference numerals 200 and 210).

To improve the adhesion, prior to the application of a SAM coating, a second pretreatment step is performed in which surfaces of the MEMS structure are contacted with a plasma which was generated from a source gas comprising oxygen and, optionally, a source of hydrogen. The treatment oxidizes the surfaces, which are then reacted with hydrogen to form bonded OH groups on the surfaces. The hydrogen source may be present as part of the plasma source gas, so that the bonded OH groups are created during treatment of the surfaces with the plasma. Examples of hydrogen sources include $NH_3$ or steam, by way of example and not by way of limitation. In the alternative, the plasma-treated, oxidized surfaces may be subsequently exposed to a gas containing a source of hydrogen, such as a mixture of hydrogen with an inert gas, or $NH_3$, so that the oxidized surface reacts with the hydrogen to create bonded OH groups on the MEMS surfaces.

The plasma used to oxidize the MEMS structure surface should have a plasma density of about $1 \times 10^8$ $e^-/cm^3$ or less at the substrate surface, and the plasma treatment should be carried out without a bias applied to the substrate. Typically, the plasma density is within the range of about $1 \times 10^7$ $e^-/cm^3$ to about $1 \times 10^8$ $e^-/cm^3$ at the substrate surface.

Typically, the plasma used to treat the MEMS structure surfaces is an externally generated plasma. The use of an external plasma generation source provides the ability to control the plasma to exhibit a low, yet uniform, ion density, preventing undesirable etching and/or ion bombardment of the MEMS structure surface during oxidation of the surface. The plasma typically has an ion density of about $1 \times 10^{11}$ $e^-/cm^3$ to about $1 \times 10^{12}$ $e^-/cm^3$ at the plasma generation source; however, the ion density of the plasma is permitted to drop off to about $1 \times 10^7$ $e^-/cm^3$ to about $1 \times 10^8$ $e^-/cm^3$ by the time the plasma reaches the substrate surface. One skilled in the art to which the present invention belongs will be able to control the holding time or stabilization time of the plasma prior to contacting the substrate surface in order to ensure that the plasma density at the substrate surface is within a desired range.

The plasma pretreatment process of the invention is a very gentle, isotropic process which is performed for the sole purpose of preparing the surface for reaction with a SAM precursor, such as the chlorosilane head of an alkylchlorosilane. The highly isotropic process allows all exposed surfaces of the MEMS structure to be contacted with the plasma. The treatment oxidizes the surfaces, which are then reacted with hydrogen to form bonded OH groups on the surfaces. The surfaces may be silicon-containing surfaces or other surfaces within a MEMS structure, including, but not limited to, metal-containing surfaces. FIG. 2B shows a hydrolyzed surface 220 of a MEMS structure.

In general, an oxidant is diffused toward the MEMS structure. The oxidant is preferably in a vapor-phase, and can comprise, for example, one or both of OH radicals and steam. The oxidant oxidizes exposed surfaces of the MEMS structure. If OH radicals are utilized for the oxidation of MEMS structure surfaces, the OH radicals can be generated by subjecting a precursor (such as, for example, water) to a plasma. Preferably, the plasma is generated remotely relative to the processing chamber, such that the plasma does not contact exposed surfaces of the MEMS structure during generation of the OH radicals. The substrate can be subjected to a water rinse after exposure to OH radicals, and, depending on the precursor utilized to generate the radicals, such rinse may or may not be desired.

Oxygen typically makes up about 20 volume % to about 80 volume % of the reaction-generating portion of the pretreatment plasma source gas. The source of hydrogen is typically $NH_3$ or steam, by way of example, and not by way of limitation. If $NH_3$ is used, the $NH_3$ typically makes up about 0.1 volume % to about 20 volume % of the reaction-generating portion of the plasma source gas. More typically, the $NH_3$ makes up about 0.5 volume % to about 10 volume % of the reaction-generating portion of the plasma source gas. The presence of nitrogen in the plasma source gas speeds up the rate of oxidation. Nitrogen ($N_2$) may be present at about 20 volume % to about 80 volume % of the reaction-generating portion of the plasma source gas.

The plasma source gas may also include a nonreactive diluent gas, such as argon, helium, neon, xenon, krypton, and combinations thereof, for example, and not by way of limitation. The nonreactive diluent gas typically makes up about 20 volume % to about 80 volume % of the plasma source gas, with the remaining 80 volume % to 20 volume % being the reaction-generating portion of the plasma source gas.

Typical processing conditions for the second pretreatment step are as follows: 500–1000 sccm of $O_2$; 5–50 sccm of $NH_3$; 4–10 Torr process chamber pressure; and about 5 kW plasma source power. The second pretreatment step is performed at a substrate temperature within the range of about 20° C. to about 80° C.; more typically, within the range of about 20° C. to about 50° C. Processing time is typically within the range of about 3 minutes to about 5 minutes. The processing conditions set forth above are for use with the plasma processing system shown in schematic in FIG. 3; however, one skilled in the art may use any suitable plasma processing system available in the industry, with appropriate adjustments to the processing conditions.

In an alternative embodiment, the MEMS structure is first treated with a plasma which was generated from a source gas comprising oxygen, followed by exposure of the surfaces to a hydrogen source, such as $NH_3$, steam, or $H_2O$, by way of example, and not by way of limitation. The treatment oxidizes the surfaces, which are reacted with hydrogen, in a subsequent processing step, to form bonded OH groups on the surfaces.

A SAM-coating is then applied to exposed surfaces of the MEMS structure by contacting the surfaces with vapor-phase alkylsilane-containing molecules (such as OTS, FDTS, and DMDS). These reagents are introduced into the processing chamber by bubbling an anhydrous, inert gas through a liquid source of the alkylsilane-containing reagent to transport the reagent in vapor phase into the reaction chamber. In the alternative, a Direct Liquid Inject™ system may be used in which the flow rates of the reagents are measured as a liquid, and then the liquids are vaporized just prior to insertion into the processing chamber, with inert carrier gas being fed into a port of the vaporizer. Typically, the reaction between the alkylsilane and the exposed substrate surfaces is carried out at a substrate temperature ranging from about 20° C. to about 80° C. (more typically, from about 20° C. to about 50° C.), at a pressure ranging from about 800 mTorr to about 2 Torr. The pressure is low because it is desired to produce only a single monolayer on the substrate surface. This reaction may also be carried out in the same processing chamber as that described with reference to the etch/clean cycle steps and the oxidation step, providing a process integration which provides significant production cost savings.

During application of a SAM coating, the chlorosilane-based head of an alkylchlorosilane, shown as 212 in FIG. 2A, reacts with the hydrolyzed surface, shown as 220 in FIG. 2B, liberating one molecule of HCl for each Si—Cl bond that is hydrolyzed. FIG. 2C shows a MEMS surface 230 on which a self-assembled monolayer of individual FDTS molecules 210 has been grown. A similar structure may be achieved for a self-assembled monolayer of individual OTS molecules.

During application of the SAM coating to surfaces of the MEMS structure, a SAM coating typically also forms on surfaces of the processing chamber. This SAM coating needs to be removed from surfaces of the processing chamber prior to the performance of subsequent processing steps within the chamber. Therefore, after removal of the substrate from the chamber, the present method typically also includes a chamber cleaning step, comprising contacting surfaces of the processing chamber with a plasma generated from a source gas comprising oxygen, whereby residual SAM is removed from processing chamber surfaces. Typical processing conditions for the chamber cleaning step are as follows: 500–1000 sccm of $O_2$; 4–10 Torr process chamber pressure; and about 5 kW plasma source power. The chamber cleaning step is performed at a temperature within the range of about 20° C. to about 80° C.; more typically, within the range of about 20° C. to about 50° C. Processing time is typically within the range of about 5 minutes to about 10 minutes. The processing conditions set forth above are for use with the plasma processing system shown in schematic in FIG. 3; however, one skilled in the art may use any suitable plasma processing system available in the industry, with appropriate adjustments to the processing conditions.

A higher density plasma can be used during the chamber cleaning step than during the first and second pretreatment steps, because it is no longer necessary to avoid ion bombardment of the substrate (which has been removed from the chamber). Typically, the ion density of the plasma in the chamber during the cleaning step is within the range of about $1 \times 10^7$ $e^-/cm^3$ to about $1 \times 10^{11}$ $e^-/cm^3$.

The above described embodiments are not intended to limit the scope of the present invention, as one skilled in the art can, in view of the present disclosure, expand such embodiments to correspond with the subject matter of the invention claimed below.

We claim:

1. An integrated method for release and passivation of a MEMS structure, comprising:
    a) loading a substrate including at least one MEMS structure into a processing chamber;
    b) a first pretreatment step comprising contacting said substrate with a plasma generated from a first pretreatment source gas comprising oxygen and a source of hydrogen;
    c) a release process, during which a sacrificial layer present within said MEMS structure is removed;
    d) a second pretreatment step, comprising contacting surfaces of said MEMS structure with a plasma generated from a second pretreatment source gas comprising oxygen and a source of hydrogen; and
    e) applying a hydrophobic, self-assembled monolayer (SAM) coating to exposed surfaces of said MEMS structure.

2. The method of claim 1, wherein said oxygen comprises about 20 volume % to about 80 volume % of a reaction-generating portion of said second pretreatment source gas.

3. The method of claim 1, wherein said source of hydrogen is selected from the group consisting of $NH_3$ and steam.

4. The method of claim 3, wherein said second pretreatment source gas includes $NH_3$.

5. The method of claim 4, wherein said $NH_3$ comprises about 0.1 volume % to about 20 volume % of a reaction-generating portion of said second pretreatment source gas.

6. The method of claim 5, wherein said $NH_3$ comprises about 0.5 volume % to about 10 volume % of a reaction-generating portion of said second pretreatment source gas.

7. The method of claim 1, wherein said second pretreatment source gas further includes $N_2$, wherein $N_2$ comprises about 20 volume % to about 80 volume % of a reaction-generating portion of said second pretreatment source gas.

8. The method of claim 1, wherein said second pretreatment source gas further includes a nonreactive diluent gas selected from the group consisting of argon, helium, neon, kxypton, xenon, and combinations thereof, wherein said nonreactive diluent gas comprises about 20 volume % to about 80 volume % of said second pretreatment source gas.

9. The method of claim 1, wherein said second pretreatment step is performed at a substrate temperature within the range of about 20° C. to about 80° C.

10. The method of claim 1, wherein an ion density of said plasma during performance of said second pretreatment step is about $1 \times 10^8$ $e^-/cm^3$ or less at the surface of said substrate.

11. The method of claim 1, wherein said second pretreatment plasma is an externally generated plasma.

12. The method of claim 1, wherein said method further comprises:
   f) removing said substrate from said processing chamber; and
   g) a chamber cleaning step, comprising contacting surfaces of said processing chamber with a plasma generated from a source gas comprising oxygen, whereby residual SAM is removed from said processing chamber surfaces.

13. An integrated method for release and passivation of a MEMS structure, comprising:
   a) loading a substrate including at least one MEMS structure into a processing chamber;
   b) a first pretreatment step comprising contacting said substrate with a plasma generated from a first pretreatment source gas comprising oxygen;
   c) a release process, during which a sacrificial layer present within said MEMS structure is removed;
   d) an oxidation step, comprising contacting surfaces of said MEMS structure with a plasma generated from a second pretreatment source gas comprising oxygen;
   e) a hydrolysis step, comprising contacting surfaces of said MEMS structure with a source of hydrogen; and
   f) applying a hydrophobic, self-assembled monolayer (SAM) coating to exposed surfaces of said MEMS structure.

14. The method of claim 13, wherein said source of hydrogen is selected from the group consisting of $NH_3$, steam, and $H_2O$.

15. The method of claim 13, wherein said second pretreatment source gas further includes $N_2$, wherein $N_2$ comprises about 20 volume % to about 80 volume % of a reaction-generating portion of said second pretreatment source gas.

16. The method of claim 13, wherein said second pretreatment source gas further includes a nonreactive diluent gas selected from the group consisting of argon, helium, neon, krypton, xenon, and combinations thereof, wherein said nonreactive diluent gas comprises about 20 volume % to about 80 volume % of said second pretreatment source gas.

17. The method of claim 13, wherein said second pretreatment step is performed at a substrate temperature within the range of about 20° C. to about 80° C.

18. The method of claim 13, wherein an ion density of said plasma during performance of said second pretreatment step is about $1 \times 10^8$ $e^-/cm^3$ or less at the surface of said substrate.

19. The method of claim 13, wherein said second pretreatment plasma is an externally generated plasma.

20. The method of claim 13, wherein said method further comprises:
   f) removing said substrate from said processing chamber; and
   g) a chamber cleaning step, comprising contacting surfaces of said processing chamber with a plasma generated from a source gas comprising oxygen, whereby residual SAM is removed from said processing chamber surfaces.

21. A method of improving the adhesion of a hydrophobic self-assembled monolayer (SAM) coating to a surface of a MEMS structure, comprising:
   a) contacting surfaces of said MEMS structure with a plasma generated from a source gas comprising oxygen and a source of hydrogen; and
   b) applying a hydrophobic, self-assembled monolayer (SAM) coating to exposed surfaces of said MEMS structure.

22. The method of claim 21, wherein said oxygen comprises about 20 volume % to about 80 volume % of a reaction-generating portion of said second pretreatment source gas.

23. The method of claim 21, wherein said source of hydrogen is selected from the group consisting of $NH_3$ and steam.

24. The method of claim 23, wherein said plasma source gas includes $NH_3$.

25. The method of claim 24, wherein said $NH_3$ comprises about 0.1 volume % to about 20 volume % of a reaction-generating portion of said plasma source gas.

26. The method of claim 25, wherein said $NH_3$ comprises about 0.5 volume % to about 10 volume % of a reaction-generating portion of said plasma source gas.

27. The method of claim 21, wherein said plasma source gas further includes $N_2$, wherein $N_2$ comprises about 20 volume % to about 80 volume % of the reaction-generating portion of said plasma source gas.

28. The method of claim 21, wherein said plasma source gas further comprises a nonreactive diluent gas selected from the group consisting of argon, helium, neon, krypton, xenon, and combinations thereof, wherein said nonreactive diluent gas comprises about 20 volume % to about 80 volume % of said plasma source gas.

29. The method of claim 21, wherein said method is performed at a substrate temperature within the range of about 20° C. to about 80° C.

30. The method of claim 21, wherein an ion density of said plasma is about $1 \times 10^8$ $e^-/cm^3$ or less at the surface of said substrate.

31. The method of claim 21, wherein said plasma is an externally generated plasma.

32. A method of improving the adhesion of a hydrophobic self-assembled monolayer (SAM) coating to a surface of a MEMS structure, comprising:
   a) contacting surfaces of said MEMS structure with a plasma generated from a source gas comprising oxygen;
   b) contacting surfaces of said MEMS structure with a source of hydrogen; and
   c) applying a hydrophobic, self-assembled monolayer (SAM) coating to exposed surfaces of said MEMS structure.

33. The method of claim 32, wherein said source of hydrogen is selected from the group consisting of $NH_3$, steam, and $H_2O$.

34. The method of claim 32, wherein said plasma source gas further includes $N_2$, wherein $N_2$ comprises about 20 volume % to about 80 volume % of the reaction-generating portion of said plasma source gas.

35. The method of claim 32, wherein said plasma source gas further comprises a nonreactive diluent gas selected from the group consisting of argon, helium, neon, krypton, xenon, and combinations thereof, wherein said nonreactive diluent gas comprises about 20 volume % to about 80 volume % of said plasma source gas.

36. The method of claim 32, wherein said method is performed at a substrate temperature within the range of about 20° C. to about 80° C.

37. The method of claim 32, wherein an ion density of said plasma is about $1 \times 10^8$ $e^-/cm^3$ or less at the surface of said substrate.

38. The method of claim 32, wherein said plasma is an externally generated plasma.

* * * * *